United States Patent
Zhu et al.

(10) Patent No.: US 11,508,723 B2
(45) Date of Patent: Nov. 22, 2022

(54) POWER SEMICONDUCTOR DEVICE WITH A TEMPERATURE SENSOR

(71) Applicants: Dynex Semiconductor Limited, Lincolnshire (GB); Zhuzhou CRRC Times Electric Co. Ltd., Hunan (CN)

(72) Inventors: Chunlin Zhu, Lincolnshire (GB); Vinay Suresh, Lincolnshire (GB); Ian Deviny, Lincolnshire (GB); Yangang Wang, Lincolnshire (GB)

(73) Assignees: DYNEX SEMICONDUCTOR LIMITED, Lincolnshire (GB); ZHUZHOU CRRC TIMES ELECTRIC CO. LTD., Hunan (CN)

( * ) Notice: Subject to any disclaimer, the term of this patent is extended or adjusted under 35 U.S.C. 154(b) by 43 days.

(21) Appl. No.: 17/251,264

(22) PCT Filed: Jun. 13, 2018

(86) PCT No.: PCT/GB2018/051613
§ 371 (c)(1),
(2) Date: Dec. 11, 2020

(87) PCT Pub. No.: WO2019/239084
PCT Pub. Date: Dec. 19, 2019

(65) Prior Publication Data
US 2021/0257355 A1    Aug. 19, 2021

(51) Int. Cl.
*H01L 29/66* (2006.01)
*H01L 29/78* (2006.01)
(Continued)

(52) U.S. Cl.
CPC .... *H01L 27/0629* (2013.01); *H01L 21/76232* (2013.01); *H01L 23/34* (2013.01);
(Continued)

(58) Field of Classification Search
CPC .......... H01L 29/4236; H01L 29/66272; H01L 29/66136; H01L 29/66348;
(Continued)

(56) References Cited

U.S. PATENT DOCUMENTS 7,507,023 B2 * 3/2009 Oyabe .................. H01L 29/861
327/512
2009/0127624 A1 * 5/2009 Sumitomo ...... H01L 21/823487
257/350
(Continued)

OTHER PUBLICATIONS

International Search Report and Written Opinion dated Feb. 19, 2019 for corresponding International Patent Application No. PCT/GB2018/051613.

*Primary Examiner* — Natalia A Gondarenko
(74) *Attorney, Agent, or Firm* — Tarolli, Sundheim, Covell & Tummino LLP (57) ABSTRACT

We describe herein a high voltage semiconductor device comprising a power semiconductor device portion (100) and a temperature sensing device portion (185). The temperature sensing device portion comprises: an anode region (140), a cathode region (150), a body region (160) in which the anode region and the cathode region are formed. The temperature sensing device portion also comprises a semiconductor isolation region (165) in which the body region is formed, the semiconductor isolation region having an opposite conductivity type to the body region, the semiconductor isolation region being formed between the power semiconductor device portion and the temperature sensing device portion.

15 Claims, 8 Drawing Sheets

(51) Int. Cl.
  *H01L 27/06*    (2006.01)
  *H01L 27/02*    (2006.01)
  *H01L 29/739*   (2006.01)
  *H01L 29/74*    (2006.01)
  *H01L 29/732*   (2006.01)
  *H01L 21/762*   (2006.01)
  *H01L 23/34*    (2006.01)

(52) U.S. Cl.
  CPC ...... *H01L 27/0211* (2013.01); *H01L 27/0664* (2013.01); *H01L 29/66272* (2013.01); *H01L 29/66348* (2013.01); *H01L 29/66371* (2013.01); *H01L 29/66734* (2013.01); *H01L 29/732* (2013.01); *H01L 29/7397* (2013.01); *H01L 29/7412* (2013.01); *H01L 29/7804* (2013.01)

(58) Field of Classification Search
  CPC ......... H01L 29/66287; H01L 29/66333; H01L 29/66371; H01L 29/66734; H01L 29/732; H01L 29/872; H01L 29/407; H01L 29/0692; H01L 29/0696; H01L 29/0804; H01L 29/0834; H01L 29/7397; H01L 29/7412; H01L 29/7804; H01L 29/7813; H01L 29/8611; H01L 29/866; H01L 29/868; H01L 29/87; H01L 27/0211; H01L 27/0664; H01L 27/0629; H01L 27/0635; H01L 21/76232; H01L 23/34; H01L 21/761; H01L 21/76283; H01L 21/8222; H01L 21/823878; H01L 21/8238; H01L 27/0623; H01L 27/0617; H01L 27/067; H01L 27/0255; H01L 23/52
  USPC .......... 257/501, 470, 77, 109, 350, E29.347, 257/E29.166; 438/423
  See application file for complete search history.

(56) References Cited

U.S. PATENT DOCUMENTS

2009/0230500 A1   9/2009   Koh
2011/0062545 A1   3/2011   Nakajima
2016/0056144 A1   2/2016   Yao
2016/0365294 A1   12/2016  Morl

* cited by examiner

POWER SEMICONDUCTOR DEVICE WITH A TEMPERATURE SENSOR

RELATED APPLICATIONS

The present application is a U.S. National Stage application under 35 USC 371 of PCT Application Serial No. PCT/GB2018/051613, filed on 13 Jun. 2018; the entirety of which is incorporated herein by reference.

TECHNICAL FIELD

The present disclosure relates to a temperature sensing device integrated on a power semiconductor device, particularly but not exclusively, on a transistor chip.

BACKGROUND

A power semiconductor device such as an insulated gate bipolar transistor (IGBT) used in power converters, handles high current and high voltage and may be destructed due to overheating of the junction or high temperature gradients inside the device structure. Therefore, a temperature sensor together with its driving circuit is required to drive and protect the power semiconductor device inside modern power modules. Conventionally, the power semiconductor device and the temperature sensor components are formed on different chips, to simplify the fabrication process and to reduce the manufacturing cost compared to forming them on the same chip.

To reduce or prevent temperature-induced failures, a local temperature is constantly monitored in a power semiconductor device during its operation. Some protective action could be triggered to slow down the device or immediately turn off the power device once the monitored temperature exceeds a pre-set temperature limit.

Figure 1:
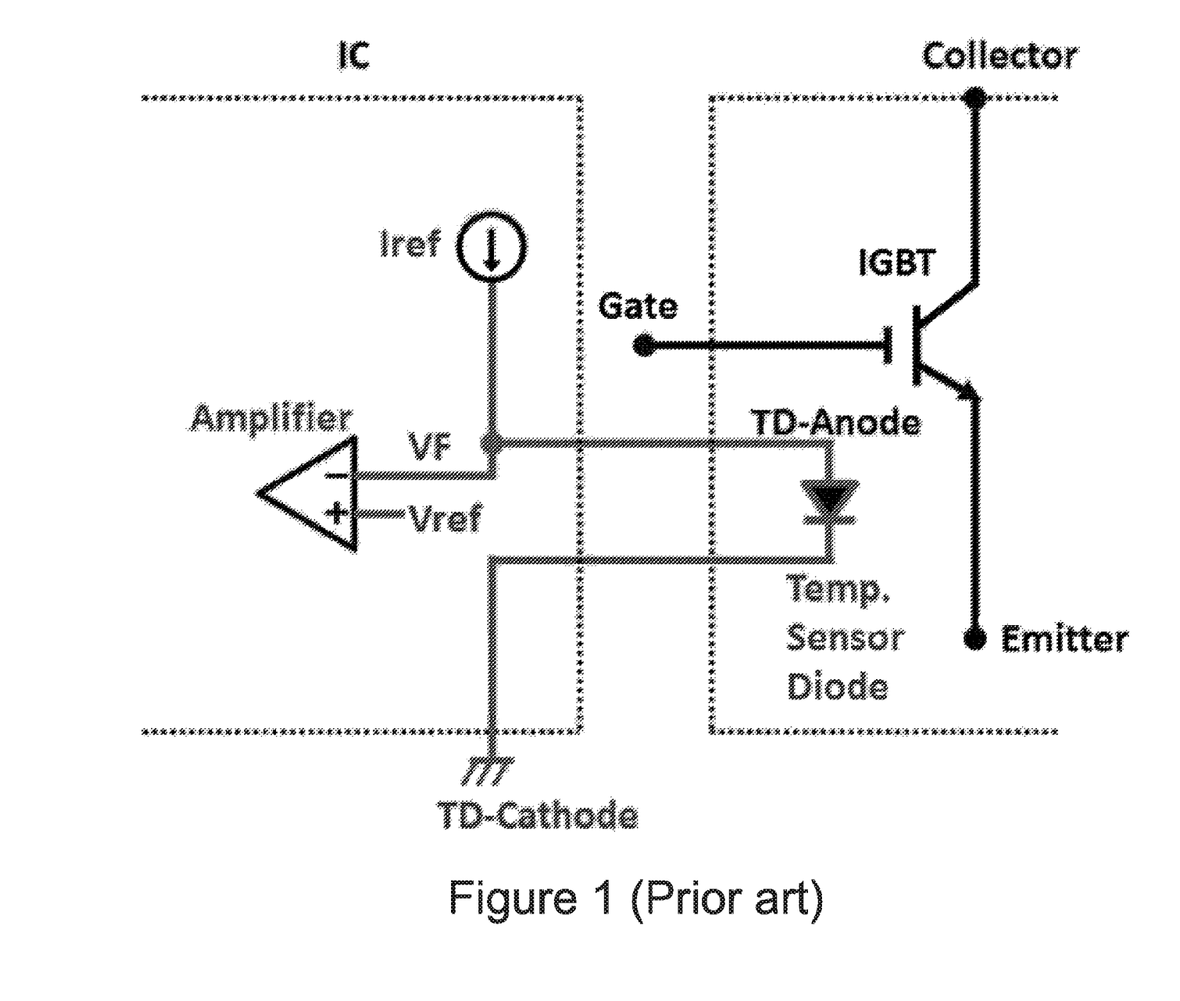
FIG. 1 a schematic configuration of a prior art temperature measurement device.

As mentioned above, the power semiconductor device and the temperature sensor and its components are constituted on separate chips, as shown in FIG. 1. A temperature sensor is disposed on a chip of the power semiconductor device, whereas the driving circuit for controlling the temperature sensor and processing an output signal is disposed on a separate chip of the integrated circuit (IC).

Figure 2:
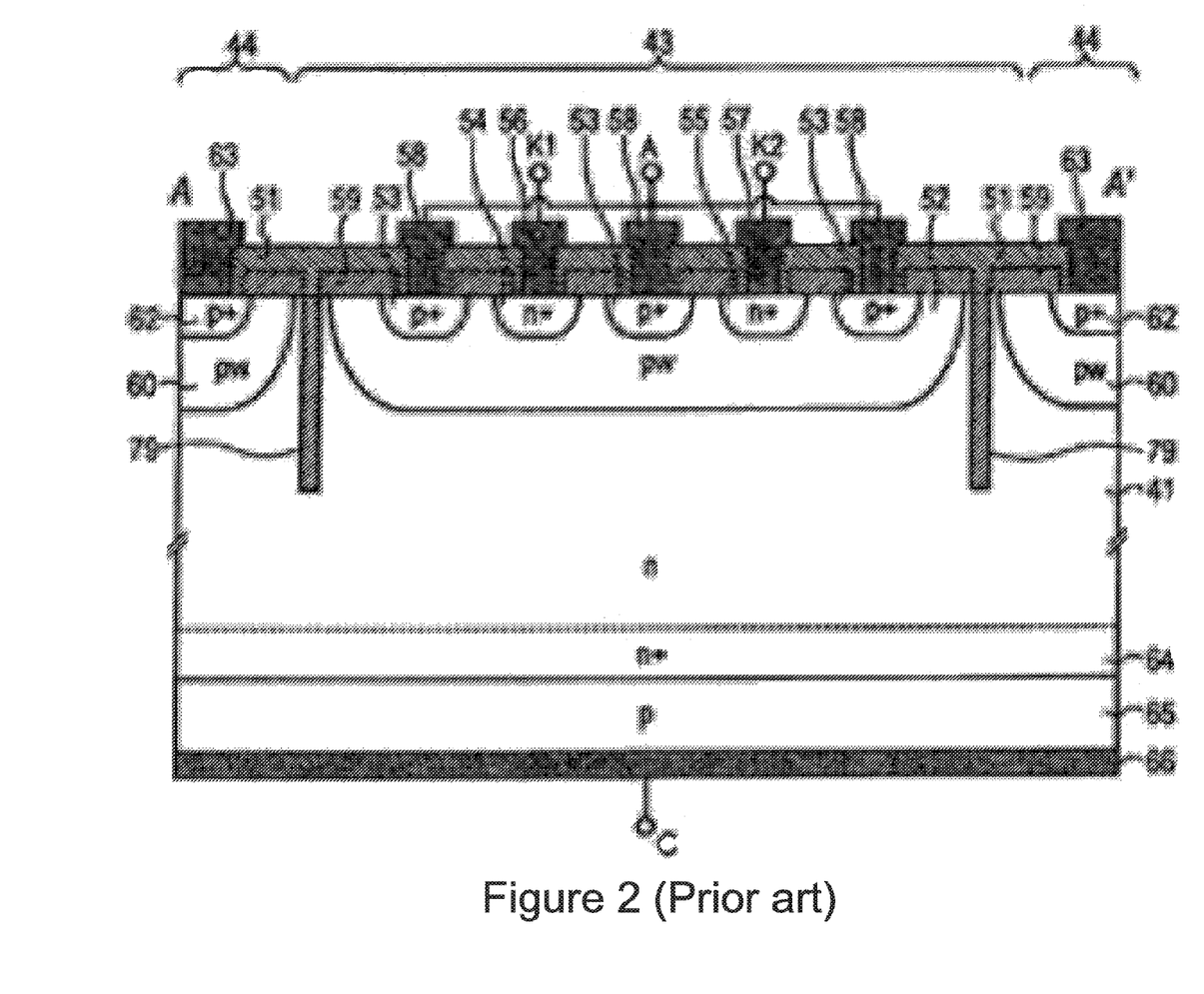
FIG. 2 is a schematic illustration of a prior art transistor with a temperature detecting diode portion.

One type of temperature sensor is described in U.S. Pat. No. 7,507,023 B2, as shown FIG. 2. In this conventional device, a temperature detecting diode is formed by means of diffusion on a surface of a silicon substrate of a power semiconductor device. The temperature dependency of a forward voltage of the diode is utilised. The forward voltage is proportionate to the temperature of the power semiconductor device. This device easily forms $n^+pnp^+$ junctions which form a thyristor effect, which can act to destroy the device through latch-up.

Another type of temperature sensor is described in US 20130266042 A1 in which a temperature sensor includes a current source connected to a transistor stack.

However, the designs/structures as described in prior art have a potential risk to trigger PNPN latch-up during the operation of the temperature sensor. When an IGBT (semiconductor region) is turned off, holes (positive carriers) pile up in an N-type substrate that becomes a drift region when the IGBT is turned on, though drawn by an emitter, leak into the temperature detecting diode. Hence, a parasitic thyristor is formed which is made of NPN and PNP transistors. An NPN transistor comprises an N-type region of the temperature detecting diode, a P-well of the temperature detecting diode and an N-type substrate. A PNP transistor comprises a P-well of the temperature detecting diode, the N-type substrate and a P-type region that becomes a collector region of the IGBT (semiconductor region).

Accordingly, there is a problem in that the temperature detecting diode may be damaged through the latch up of the thyristor effect. Furthermore, a parasitic current flows in the temperature detecting diode and thereby the driving circuit connected to the diode can be damaged.

SUMMARY

According to one aspect of the present disclosure, there is provided a high voltage semiconductor device comprising a power semiconductor device portion; a temperature sensing device portion. The temperature sensing device portion comprises: an anode region; a cathode region; a body region in which the anode region and the cathode region are formed; and a semiconductor isolation region in which the body region is formed. The semiconductor isolation region includes an opposite conductivity type to the body region, the semiconductor isolation region being formed between the power semiconductor device portion and the temperature sensing device portion.

The anode region and the semiconductor isolation region may be of a first conductivity type, and the cathode region and the body region may be of a second conductivity type, opposite to the first conductivity type.

A doping concentration level of the semiconductor isolation region may be relatively less than a doping concentration level of the anode region. The doping concentration level of the p+ isolation region is of the range of $\sim 5 \times 10^{16}$ cm$^{-3}$ to $\sim 10^{18}$ cm$^{-3}$.

Advantageously, the present disclosure develops an integrated temperature sensing diode into the already existing power semiconductor (e.g. an IGBT) chip based on the proposed process flow. Temperature detection diode region is isolated from the main power device (e.g. IGBT) region by a P-type isolation region which can be processed through the same processing step as the edge termination technology. Within the p-type isolation region, there is provided an additional n-type body region. The opposite polarities of these two regions generally avoid forming PNPN junctions between the cathode/anode and emitter terminals. Therefore no latch-up effect can be formed within the proposed device. The temperature sensing device can therefore have better reliability. The deep p+ isolation region generally provides an improved vertical isolation between the temperature sensor and the drift region (or the active region) of the power device.

Furthermore, advantageously, the p+ isolation region together with the cathode region is grounded to guarantee latch-up free in the sensor region during the normal IGBT operation.

Advantageously, the present disclosure also enables to overcome the existing lateral Isolation problems, by providing a trench Isolation between the IGBT region and the temperature detecting diode region. The present disclosure includes the temperature detecting diode in an N-type region on top of the deep p-region, thereby vertically isolating the diode region from the semiconductor region and also preventing any parasitic turn-on of the temperature detecting diode during the normal operation of the IGBT.

The semiconductor isolation region may provide a (vertical) isolation in a vertical direction compared to a surface of the semiconductor device, the isolation being between the power semiconductor device portion and the temperature sensing device portion. It will be understood that the surface of the device is the top surface from which the anode, cathode, emitter regions are extending into (inside) the device. This definition of the surface is applicable to throughout the disclosure. The vertical direction is a direction arranged substantially vertically from the surface of the device.

The semiconductor device may further comprise one or more isolation trenches between the power semiconductor device portion and the temperature sensing device portion, each isolation trench extending from a surface to an inner (or inside) portion of the high voltage semiconductor device. It will be understood that some of the trenches may also act as a trench gate of the power device portion, for example, act as a gate of an IGBT or a power MOSFET.

The one or more isolation trenches may provide a (lateral) isolation in a lateral direction parallel to the top surface of the semiconductor device, the isolation being between the power semiconductor device portion and the temperature sensing device portion.

A depth of the semiconductor isolation region may be more than a depth of the one or more trenches. A depth of the semiconductor isolation region may be less than a depth of the isolation trenches. In this instance, it involves less manufacturing steps to achieve the highly doped isolation region, which is advantageous.

The semiconductor isolation region may be formed between the isolation trenches. For example, the semiconductor isolation region (or the p+ isolation region) could be extended deeper than the trenches or it may be between two trenches having a less height or depth than the trenches.

The semiconductor device may further comprise an insulator (or oxide) region disposed between the body region and the semiconductor isolation region within the temperature sensing device portion. The insulation region may be configured to provide a further isolation in a vertical direction from a surface of the semiconductor device, the further isolation being between the power semiconductor device portion and the temperature sensing device portion. This configuration forms a silicon-on-insulator (SOI) region within the temperature sensing portion. The additional SOI structure provides improved vertical isolation between the temperature sensing portion and the power device portion.

The semiconductor isolation region may be electrically grounded using the cathode region and a cathode contact. The cathode contact may be configured to connect to the semiconductor isolation region between two consecutive isolation trenches. The semiconductor isolation region may be electrically grounded using an emitter/source region of the power semiconductor device portion, the semiconductor isolation region being between two consecutive isolation trenches. In order to bias the highly doped isolation region with a ground potential (or 0V), the isolation region is shorted with the cathode region and cathode contact using a highly doped region located in the surface.

The semiconductor isolation region between the consecutive isolation trenches may be configured to reduce a bipolar junction transistor (BJT) effect inside the temperature sensing device portion.

The semiconductor isolation region may be configured to reduce a current flow from an active region of the power semiconductor device portion to the anode region of the temperature sensing device portion.

The temperature sensing device portion may comprise an array of diodes connected in a series and/or parallel connection. There may be also a reverse conducting diode included in the same chip.

The temperature sensing device portion may be surrounded by the power semiconductor device portion, and wherein the temperature sensing device portion and the power semiconductor device portion are laterally separated by the one or more isolation trenches.

The power semiconductor device portion may comprise any one of:
 an insulated gate bipolar transistor (IGBT);
 a metal oxide semiconductor field effect transistor (MOSFET);
 a bipolar junction transistor (BJT), and
 a Thyristor.

The temperature sensing device portion may be configured to monitor a temperature of a plurality of the power semiconductor devices located on a chip.

The power semiconductor device portion and the temperature sensing device portion may be monolithically integrated on a single chip. The semiconductor device may further comprise a driver circuit integrated on the single chip.

According to a further aspect of the present disclosure, there is provided a method of manufacturing a high voltage semiconductor device, the method comprising:
 forming a power semiconductor device portion;
 forming a temperature sensing device portion, wherein the temperature sensing device portion comprises an anode portion and a cathode portion;
 forming the anode portion and the cathode portion in a body region; and
 forming a semiconductor isolation region in which the body region is formed, the semiconductor isolation region having an opposite conductivity type to the body region, the semiconductor isolation region being formed between the power semiconductor device portion and the temperature sensing device portion.

The semiconductor isolation region may be formed using an edge termination technology.

BRIEF DESCRIPTION OF THE PREFERRED EMBODIMENTS

The present disclosure will be understood more fully from the detailed description that follows and from the accompanying drawings, which however, should not be taken to limit the disclosure to the specific embodiments shown, but are for explanation and understanding only.

DETAILED DESCRIPTION OF THE
PREFERRED EMBODIMENTS

Figure 3:
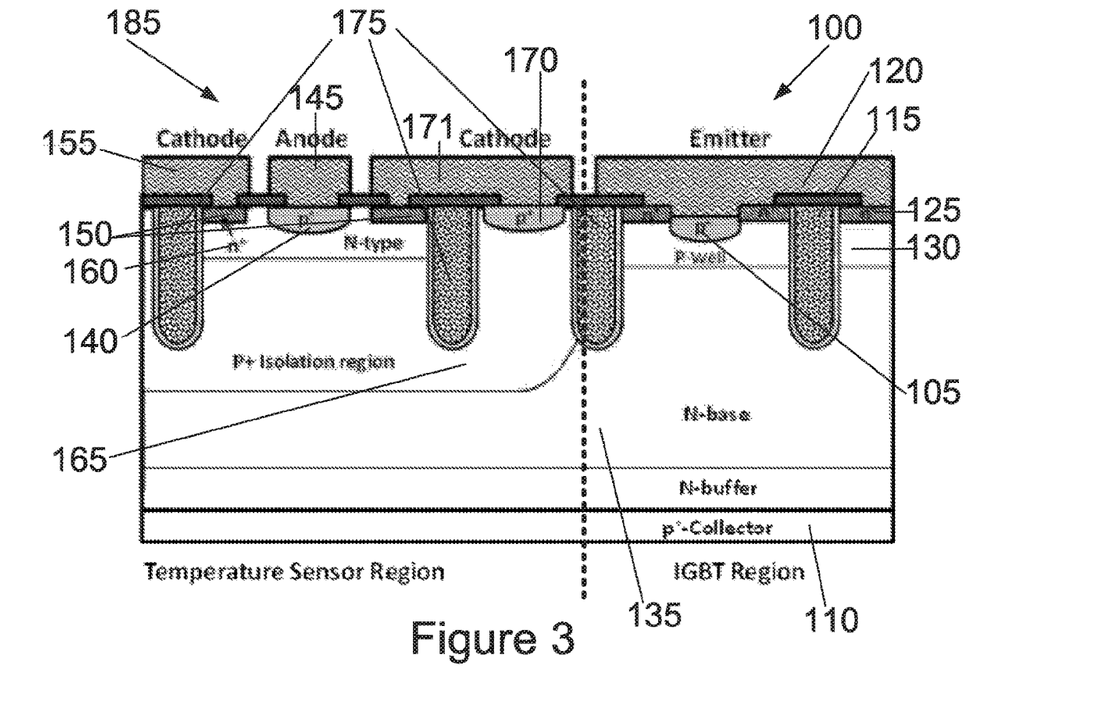
FIG. 3 is a schematic illustration of a high voltage semiconductor device according to a first embodiment.

FIG. 3 illustrates a high voltage insulated gate bipolar transistor (IGBT) 100 including a temperature sensor region according to one embodiment. The IGBT 100 with the temperature sensor includes an emitter 105, 125 (n region 125 and p region 105 collectively form the emitter), a collector 110 and a trench gate 115. An emitter Ohmic contact 120 is placed in direct contact with the emitter region 105, 125. The IGBT 100 also includes an n-type drift region 135 between the collector region 110 and emitter region 105, 125. The emitter region 105, 125 are formed within a p-well region 130.

Upon application of the appropriate voltage, a channel is formed in a vertical direction between the drift region 135 and emitter 125 along the trench 115.

The device of FIG. 3 also includes a temperature sensor region 185, which is laterally adjacent to the IGBT portion 100. The vertical dotted line in FIG. 3 shows the boundary between the IGBT portion 100 and the temperature sensor portion 185. The temperature sensor region 185 includes a P+ anode region 140 with an anode Ohmic contact 145 and an N+ cathode region 150 with a cathode Ohmic contact 155. The temperature sensor region 185 also includes an N type doped body region 160 in which the anode region 140 and the cathode region 150 are formed. It will be understood that the anode region 140 and the cathode region 150 together form a temperature detecting diode. The temperature sensor 185 further comprises P+ type doped deep isolation region 165. This isolation region 165 avoids any leakage current to flow from the active (or drift) region 135 of the IGBT to the temperature detecting diode. Hence, the isolation region 165 provides isolation in a vertical direction. The high voltage IGBT includes a plurality of isolation trenches 175 which provide isolation in a lateral direction. The isolation region 165 extends beyond a depth of the trenches 175 in the vertical direction. The isolation region 165 extends towards the (top) surface of the device. At the (top) surface, the isolation region is a p+ region 170 which is shorted with an n+ region 195 through a cathode contact 171. The additional p+ region 170 or the isolation region at the surface acts as a protection region acting to reduce contact resistance. The cathode contact 171 shorting the additional p+ region 170 and the n+ region 195 are generally grounded or biased with 0V (and thus grounding the p+ isolation region 165). It will be appreciated that the additional p+ region 170 is part of the p+ isolation region 165, but the additional p+ region 170 is located at the (top) surface of the device and being used to ground the p+ isolation region 165. It will be appreciated that, in FIG. 3, the cathode metal 171 and 155 may be the same cathode contact or a separate cathode contact.

Figure 4:
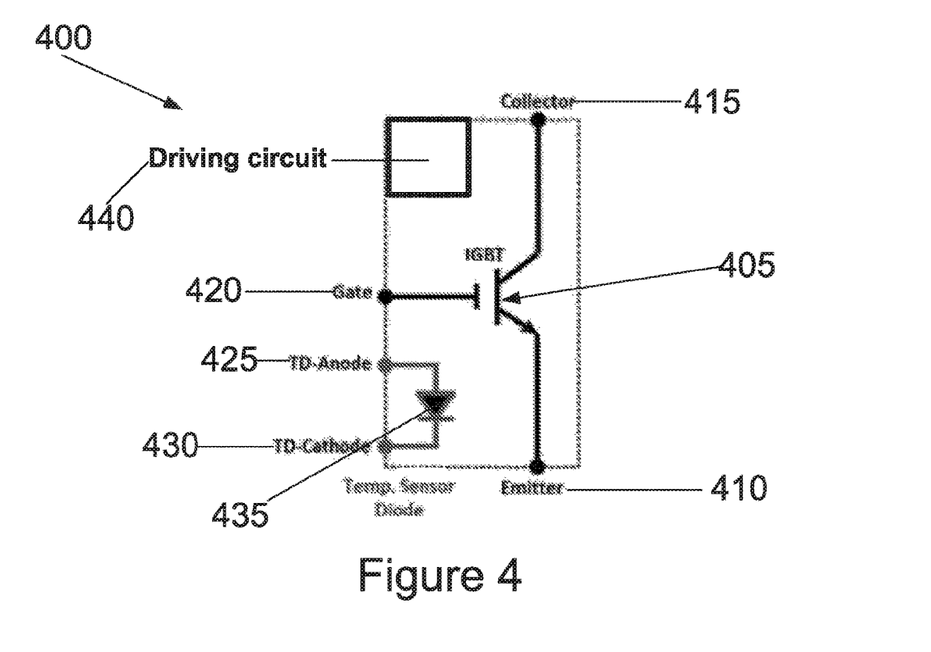
FIG. 4 a schematic representation of a temperature measurement device having the driving circuit on the same chip.

FIG. 4 shows an equivalent circuit diagram 400 of a high voltage power device with IGBT 405 and a temperature sensor diode 435. Driving circuitry 440 is required to drive the temperature sensor diode. Unlike the prior art systems as shown in FIG. 1, the transistor 405, temperature sensor diode 435 and the associated driving circuitry 440 are monolithically integrated on a single chip. The IGBT 405 includes an emitter 410, a collector 415 and a gate electrode 420. The temperature sensing diode 435 includes an anode 425 and a cathode 430.

Figure 5:
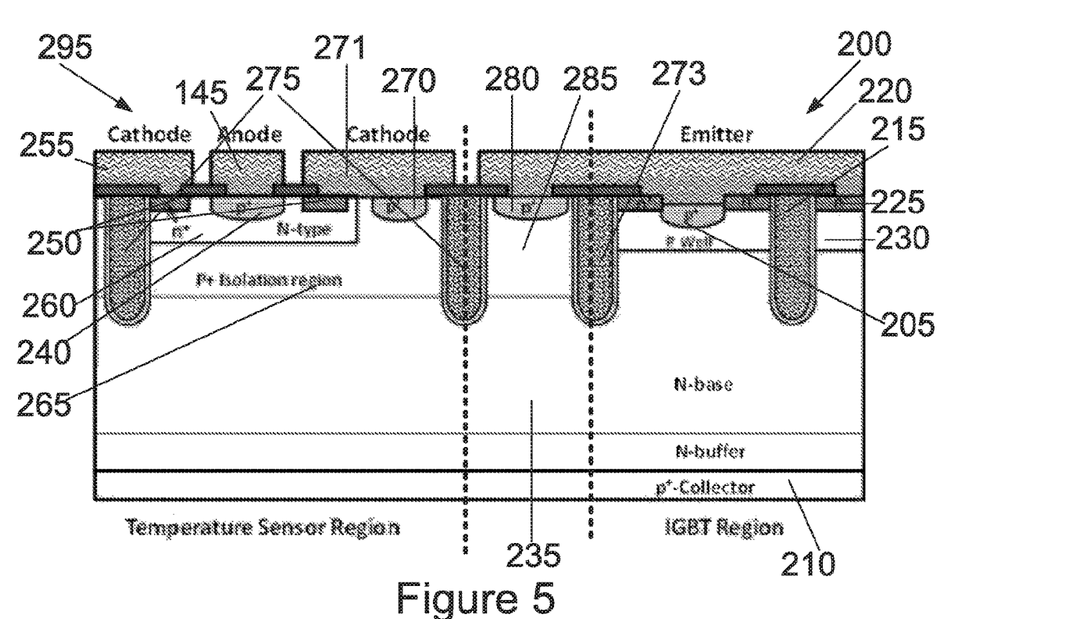
FIG. 5 is a schematic illustration of high voltage semiconductor device according to a second embodiment.

FIG. 5 illustrates a high voltage device including a temperature sensor region 295 according to a second embodiment. The high voltage device includes an IGBT region 200. The IGBT region 200 includes an emitter 205, 225, a collector 210 and a trench gate 215. An emitter Ohmic contact 220 is placed in direct contact with the emitter region 205, 225. There is provided an IGBT drift region 235 between the emitter region 205, 225 and the collector region 210. The emitter region 205, 225 are formed within a p-well region 230. Upon application of the appropriate voltage, a channel is formed in a vertical direction (from the top surface) between the drift region 235 and the emitter 225 along the trench 215.

The temperature sensor region 295 includes a P+ type doped anode region 240 with an anode Ohmic contact 245 and an N+ type doped cathode region 250 with a cathode Ohmic contact 255. The temperature sensor region 295 also includes an N type doped body region 260 in which the anode region 240 and the cathode region 250 are formed. The anode region 240 and the cathode region 250 together form a temperature detecting diode. The temperature sensor region 295 further comprises P+ type doped deep isolation region 265. The high voltage device includes a plurality of isolation trenches 275 which provide isolation in a lateral direction. The P+ type doped region 270 (which is used to reduce contact resistance) is generally grounded (or 0V). The P+ isolation region 265 inside the temperature sensor region 295 is grounded to the N+ cathode metal 271 to avoid the parasitic bipolar junction transistor (BJT) turn-on effect during the normal operation of IGBT. There is a further P+ doped region 280 inside the inter-region 285 (between trench 275 and 273), which is grounded to the emitter Ohmic contact 220 of the IGBT portion 200. The thickness of the P+ type doped isolation region 265 is less than the depth of the trenches. Therefore, the depth of the isolation region 265 is less than the depth of the isolation region 165 of FIG. 3. This design reduces the processing time of the device used for low voltage applications. It will be understood that the doped region 270 and the additional doped region 280 are being shorted via the ground connection (or 0V connection). It will be appreciated that, in FIG. 5, the cathode metal 271 and 255 may be the same cathode contact or a separate cathode contact.

It will be understood from the examples of FIG. 3 and FIG. 5 that the PNPN latch-up effect (as shown in the prior art device) at the temperature sensor side has been removed due to the presence of the n body region 160, 260. There is no longer the presence of PNPN junctions between the cathode/anode terminals and the collector region 110, 210. Therefore the latch-up effect is reduced (or eliminated). The p+ isolation region 165, 265 is also grounded using the p+ regions located in the surface of the device.

Figure 6:
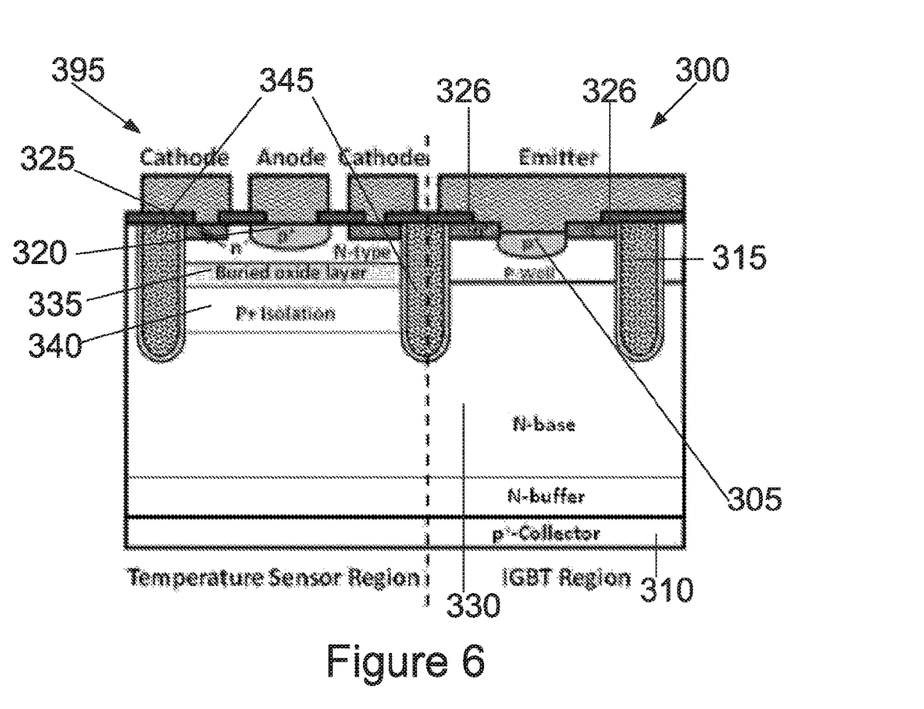
FIG. 6 is a schematic illustration of high voltage semiconductor device according to a third embodiment.

Another embodiment for the on-chip temperature sensor with an IGBT is shown in FIG. 6. Like the arrangement of FIG. 5, the IGBT region 300 includes an emitter 305, 326, a collector 310 and a trench gate 315. Temperature sensor diode region 395 with an anode region 320 and a cathode region 325 is vertically isolated from the IGBT drift region 330 by implanting a buried oxide region 335 under the diode junctions 320, 325. The buried oxide 335 is implanted on the wafer with an energy range between about 120-200 keV and a dose of ~0.3-1.8E$^{18}$ cm$^{-2}$ and annealed in inert ambient at around 1300° C. for 3-6 hrs. Typical thickness of the buried oxide layer is around 2000 Å which should provide sufficient isolation from the rest of the IGBT region 300. Furthermore, a semiconductor (P+ type) isolation layer 340 is formed under the buried oxide region 335 which provides further isolation. As discussed above, the lateral isolation is provided by the trenches 345.

It will be understood that the buried oxide layer 335 forms a silicon-on-insulator (SOI) configuration within the temperature sensor portion 395. The p+ isolation region 340 has a thickness or depth less than the depth of the trenches 345. Due to the SOI configuration 335, the PNPN latch-up effect is reduced (or completely eliminated).

Figure 7A:
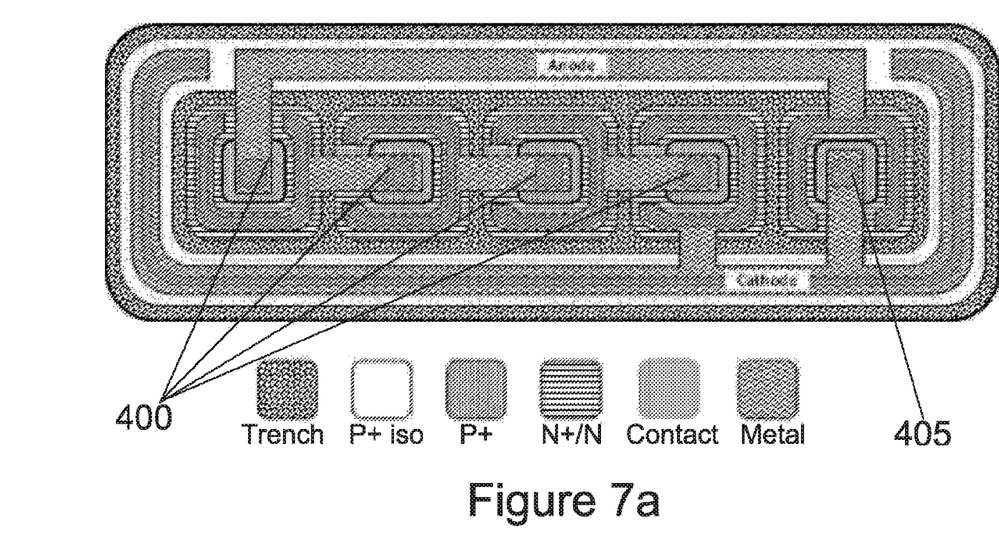
FIG. 7(a) is a top view of an example of a temperature sensor portion.
Figure 7B:
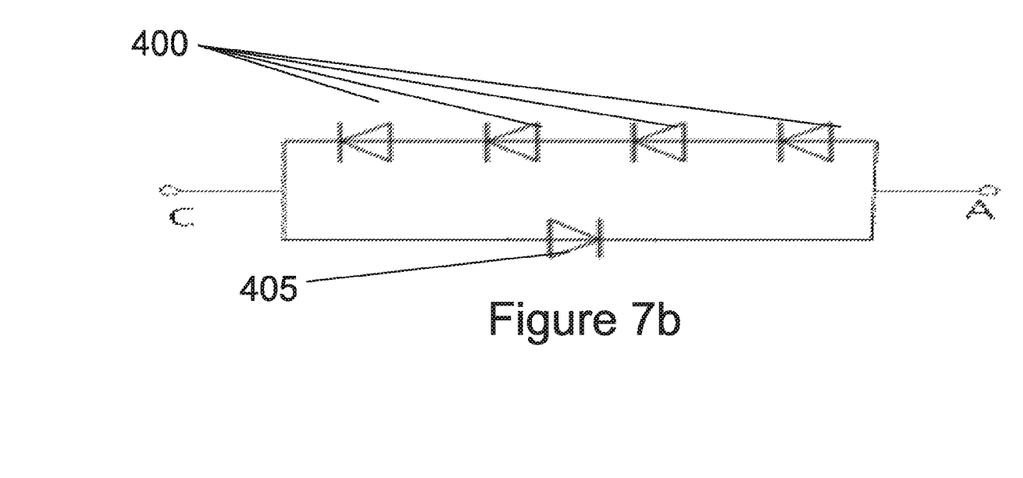
FIG. 7(b) is the equivalent circuit diagram of the temperature sensor portion of FIG. 7(a)

FIG. 7(a) shows an example of a plan view of a temperature sensor circuitry on a chip. The arrangement includes a plurality of diodes 400 connected in series with a reversed biased diode 405. In this example, four diodes 400 are connected in series with one diode arranged in the reversed biased arrangement. The reversed biased diode 405 provides protection for the sensing diodes. It will be appreciated the number of diodes or the connection of the diodes i.e. series or parallel connection may be varied depending on the requirements of the power devices. FIG. 7(b) shows schematic circuitry shown in FIG. 7(a).

Figure 8A:
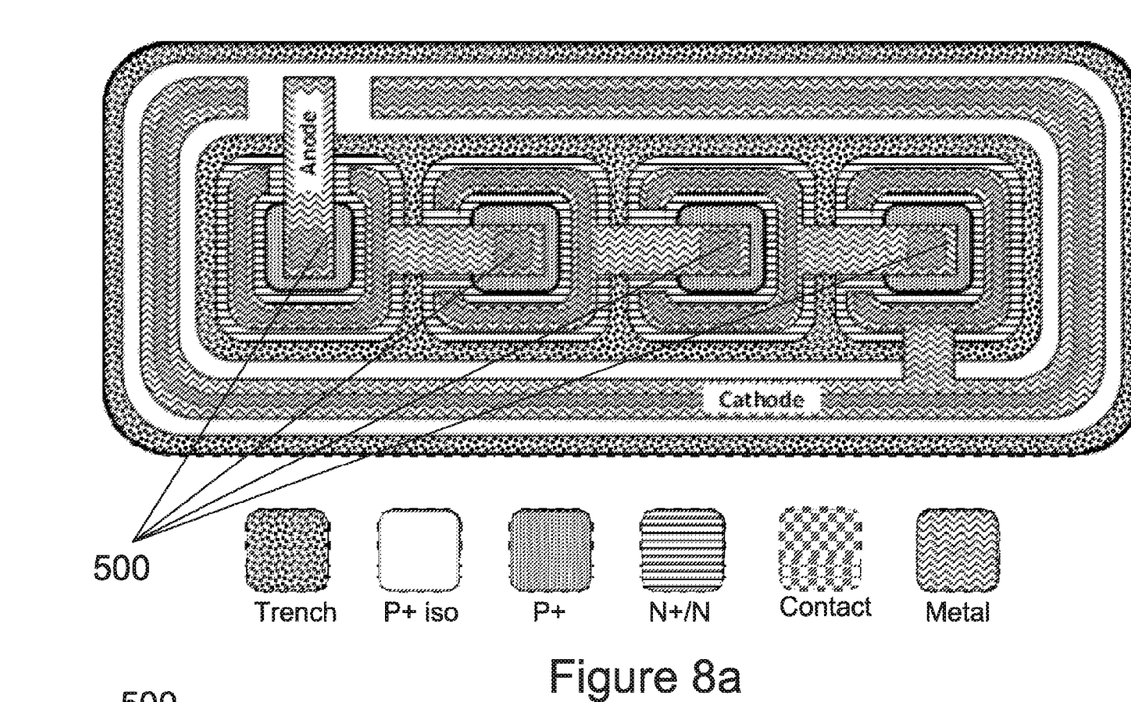
FIG. 8(a) is a top view of an alternative example of a temperature sensor portion.
Figure 8B:
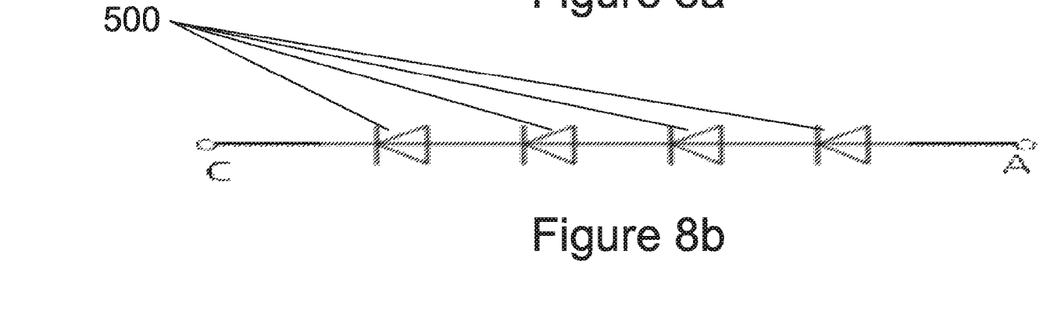
FIG. 8(b) is the equivalent circuit diagram of the temperature sensor portion of FIG. 8(a)

FIGS. 8 (a) and (b) shows another example of the temperature sensor circuitry with fours diodes 500 connected in series. This arrangement allows the diodes to withstand higher voltage during the off-state operation of the device.

Figure 9A:
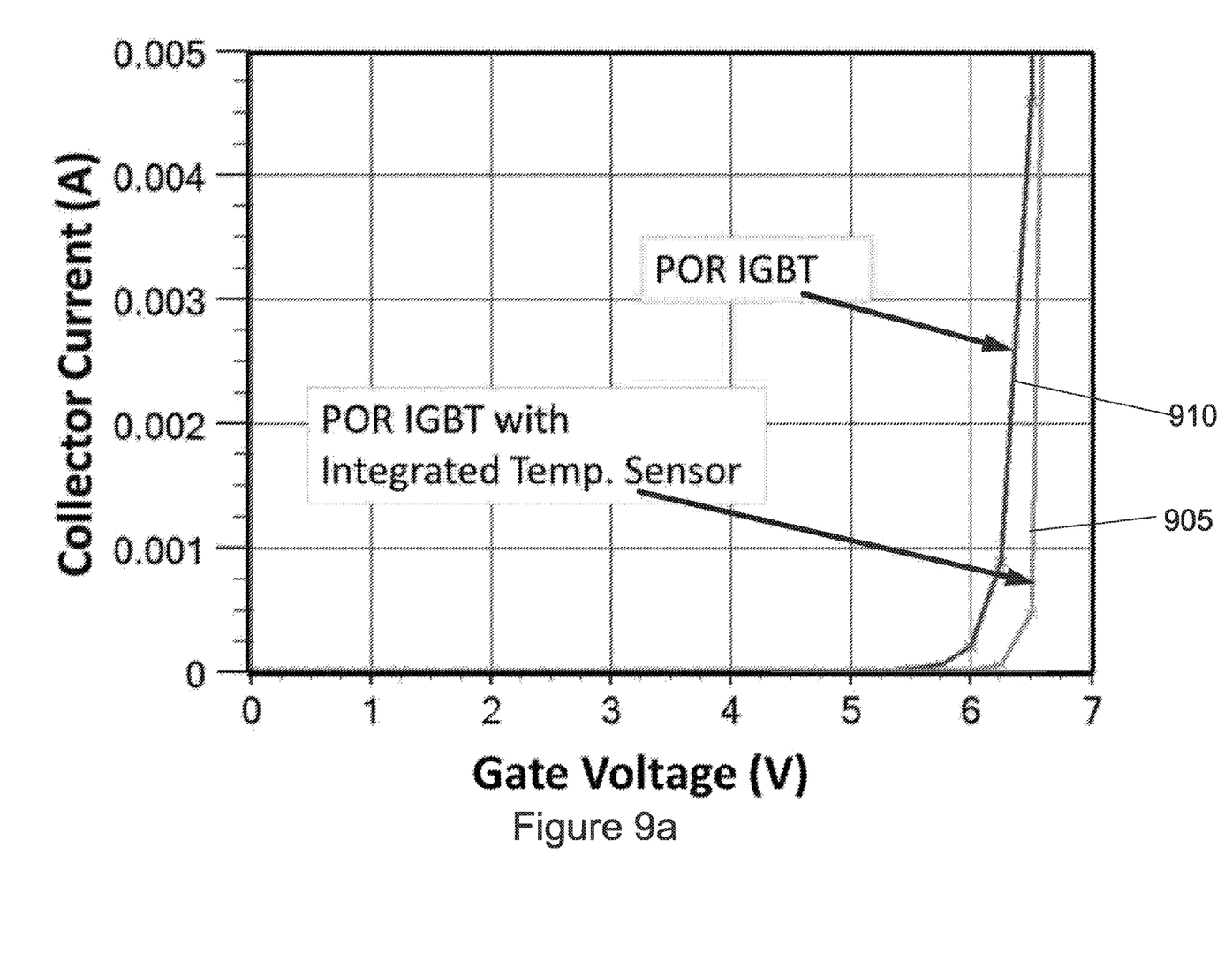
FIG. 9(a) is simulated current voltage characteristics of an IGBT with and without a temperature sensor under a reverse bias condition.
Figure 9B:
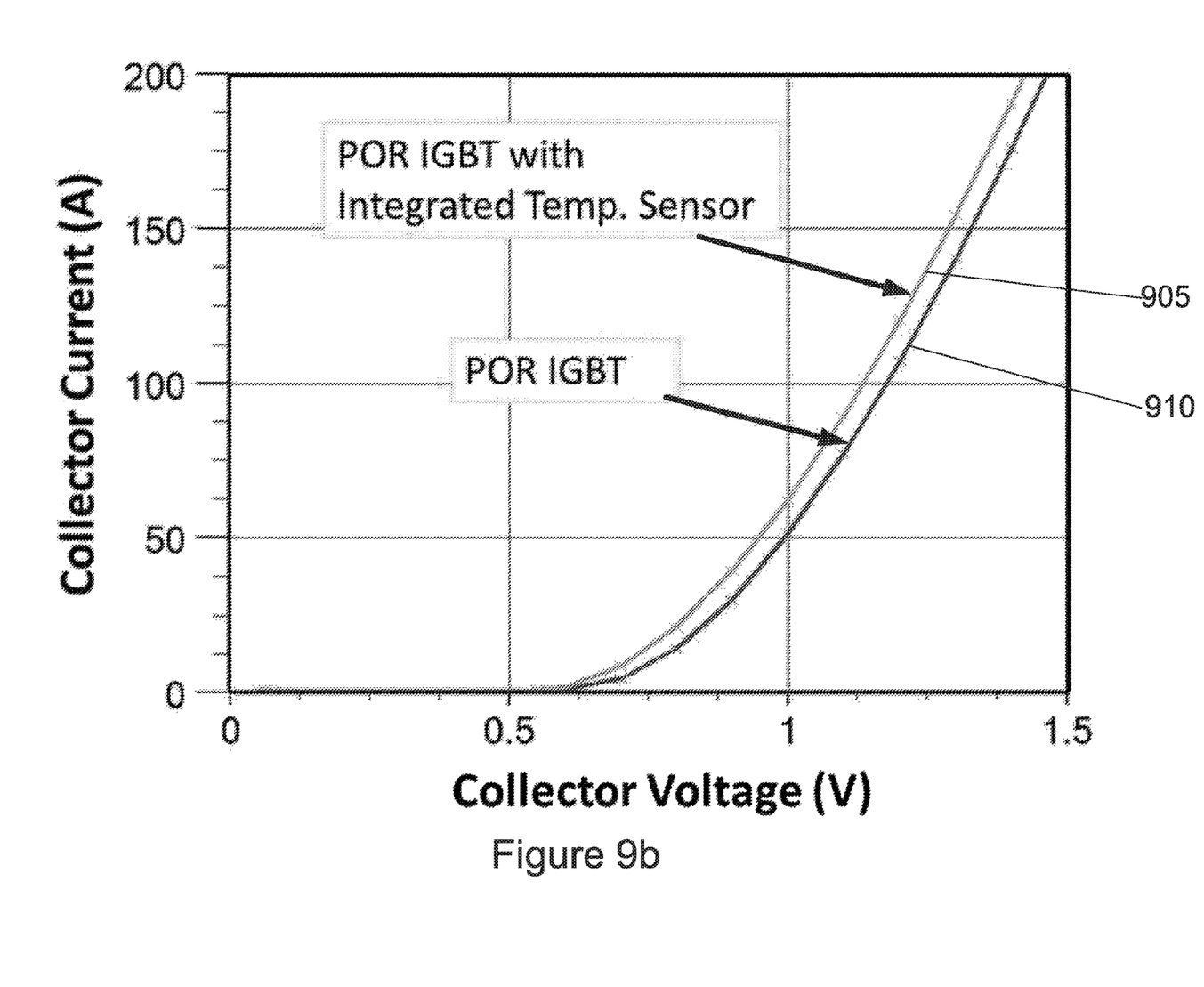
FIG. 9(b) is simulated current voltage characteristics of an IGBT with and without a temperature sensor under a forward bias condition.

To demonstrate effectiveness of the present disclosure, the performances of the IGBT of the present disclosure were simulated with and without integrated temperature sensor. FIGS. 9(a) and 9(b) show current voltage characteristics of an IGBT with and without a temperature sensor under reverse bias and forward bias conditions respectively. Simulation results show that the proposed design of the IGBT shows good isolation properties with very less leakage current flowing through the integrated temperature sensor. The graph lines 905 and 910 show the performance of the IGBT with and without the integrated temperature sensor respectively. Table 1 summarises the simulation results for POR design.

TABLE 1

Result summary for both POR with and without Integrated Temp. Sensor designs

| | VT @5 mA | VCESAT @200 A | BV @1 mA |
|---|---|---|---|
| POR Design | 6.5 V | 1.43 V | 985 V |
| POR with Integrated Temp. Sensor | 6.58 V | 1.46 V | 990 V |

Generally speaking, in the present disclosure, the temperature sensor arrangement integrated monolithically within the power semiconductor device has several advantages. These are generally that the temperature sensor portion has an n-type body region within which the anode region and cathode region are formed. The n-type body region is then formed within a highly doped p+ isolation region. The arrangement of the n-type body region and the p+ isolation region enables to reduce (or eliminate) the PNPN latch-up with the IGBT portion. This is because there are no continuous PNPN junctions between the top contacts (anode and cathode) and the bottom contact (collector). Therefore parasitic PNP and NPN transistors are disabled between the temperature sensor portion and the active power device portion. Furthermore, in certain embodiments, there is a buried oxide region formed between the n-type body region and the p+ isolation region. There buried oxide region provides better vertical isolation between the temperature sensor and the power device sections. Furthermore, the depth of the isolation region can be adjusted as necessary. A relatively shorter depth for the p+ isolation region provides less manufacturing steps for the device.

It will also be appreciated that the techniques presented above are not limited to IGBTs and applicable to other types of power transistors such as bipolar junction transistor, thyristors, and metal-oxide semiconductor field effect transistors (MOSFETs).

It will be understood that the present disclosure is particularly related to "high" voltage semiconductor devices which are also termed as power devices. It will be understood that the high voltage or power devices are operating in a range of voltage over 20V. The highest voltage range can vary depending on the exact device being used, but generally high voltage devices operate from a voltage from 20V to 20 KV. It will be also appreciated that the high voltage semiconductor devices disclosed herein could be either based on silicon or silicon carbide materials. The high voltage devices disclosed are generally vertical power semiconductor devices in which carrier flows from the source/emitter region through the channel and the drift region to the drain/collector region in a vertical direction from the gate regions. The drift region is important for power devices because it is used to sustain the high voltage in the reverse conducting mode. Generally the presence of the drift region in a power device is an important difference between the power device and low voltage device (e.g. a CMOS device).

It will also be appreciated that terms such as "lateral" and "vertical", and "under" and "over", may be used in this specification by convention and that no particular physical orientation of the device as a whole is implied.

It will be noted that the term "first conductivity type" can refer to a p-type doping polarity and the term "second conductivity" can refer to a n-type doping polarity. However, these terms are not restrictive. It will be appreciated that all doping polarities mentioned above could be reversed, the resulting devices still being in accordance with the present disclosure. It will be appreciated that the emitter (source), collector (drain) and gate could be arranged to be out-of-plane or to be differently aligned so that the direction of the carriers is not exactly as described above, the resulting devices still being in accordance with the present disclosure.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:
1. A high voltage semiconductor device comprising:
   a power semiconductor device portion;
   a temperature sensing device portion;
   wherein the temperature sensing device portion comprises:
      an anode region;
   a cathode region;
   a body region in which the anode region and the cathode region are formed; and a semiconductor isolation region in which the body region is formed, the semiconductor isolation region having an opposite conductivity type to the body region, the semiconductor isolation region being formed between the power semiconductor device portion and the temperature sensing device portion;

wherein the semiconductor isolation region provides an isolation in a vertical direction compared to a surface of the semiconductor device, the isolation being between the power semiconductor device portion and the temperature sensing device portion; and one or more isolation trenches between the power semiconductor device portion and the temperature sensing device portion, each isolation trench extending from a surface to an inner portion of the high voltage semiconductor device;

wherein the one or more isolation trenches provide an isolation in a lateral direction parallel to the surface of the semiconductor device, the isolation being between the power semiconductor device portion and the temperature sensing device portion;

wherein a depth of the semiconductor isolation region is more than a depth of the one or more isolation trenches.

2. The semiconductor device as claimed in claim 1, wherein the anode region and the semiconductor isolation region are of a first conductivity type, and the cathode region and the body region are of a second conductivity type, opposite to the first conductivity type.

3. The semiconductor device as claimed in claim 1, wherein a doping concentration level of the semiconductor isolation region is less than a doping concentration level of the anode region.

4. The semiconductor device as claimed in claim 1, wherein the semiconductor isolation region is formed between the one or more isolation trenches.

5. The semiconductor device as claimed in claim 1, further comprising an insulator region disposed between the body region and the semiconductor isolation region within the temperature sensing device portion.

6. The semiconductor device as claimed in claim 5, wherein the insulation region is configured to provide a further isolation in a vertical direction from a surface of the semiconductor device, the further isolation being between the power semiconductor device portion and the temperature sensing device portion.

7. The semiconductor device as claimed in claim 1, wherein the semiconductor isolation region is electrically grounded using the cathode region and a cathode contact.

8. The semiconductor device as claimed in claim 7, wherein the cathode contact is configured to connect to the semiconductor isolation region between two consecutive isolation trenches.

9. The semiconductor device as claimed in claim 1, wherein the semiconductor isolation region is electrically grounded using an emitter/source region of the power semiconductor device portion, the semiconductor isolation region being between two consecutive isolation trenches.

10. The semiconductor device as claimed in claim 8, wherein the semiconductor isolation region between the consecutive isolation trenches is configured to reduce a bipolar junction transistor (BJT) effect inside the temperature sensing device portion.

11. The semiconductor device as claimed in claim 1, wherein the semiconductor isolation region is configured to reduce a current flow from an active region of the power semiconductor device portion to the anode region of the temperature sensing device portion.

12. The semiconductor device as claimed in claim 1, wherein the temperature sensing device portion comprises an array of diodes connected in a series and/or parallel connection.

13. The semiconductor device as claimed in claim 1, wherein the power semiconductor device portion comprises any one of:
    an insulated gate bipolar transistor (IGBT);
    a metal oxide semiconductor field effect transistor (MOSFET);
    a bipolar junction transistor (BJT), and
    a Thyristor.

14. The semiconductor device as claimed in claim 1, wherein the power semiconductor device portion and the temperature sensing device portion are monolithically integrated on a single chip.

15. A method of manufacturing a high voltage semiconductor device, the method comprising:
    forming a power semiconductor device portion;
    forming a temperature sensing device portion, wherein the temperature sensing device portion comprises an anode portion and a cathode portion;
        forming the anode portion and the cathode portion in a body region; and
    forming a semiconductor isolation region in which the body region is formed, the semiconductor isolation region having an opposite conductivity type to the body region, the semiconductor isolation region being formed between the power semiconductor device portion and the temperature sensing device portion;
        wherein the semiconductor isolation region provides an isolation in a vertical direction compared to a surface of the semiconductor device, the isolation being between the power semiconductor device portion and the temperature sensing device portion; and
    forming one or more isolation trenches between the power semiconductor device portion and the temperature sensing device portion, each isolation trench extending from a surface to an inner portion of the high voltage semiconductor device;
        wherein the one or more isolation trenches provide an isolation in a lateral direction parallel to the surface of the semiconductor device, the isolation being between the power semiconductor device portion and the temperature sensing device portion;
        wherein a depth of the semiconductor isolation region is more than a depth of the one or more trenches.

* * * * *